(12) United States Patent
Zheng et al.

(10) Patent No.: US 8,325,850 B2
(45) Date of Patent: Dec. 4, 2012

(54) SYSTEM AND METHOD FOR DIGITAL COMMUNICATIONS WITH UNBALANCED CODEBOOKS

(75) Inventors: Lizhong Zheng, Cambridge, MA (US); Yufei Blankenship, Kildeer, IL (US)

(73) Assignee: FutureWei Technologies, Inc., Plano, TX (US)

( * ) Notice: Subject to any disclaimer, the term of this patent is extended or adjusted under 35 U.S.C. 154(b) by 441 days.

(21) Appl. No.: 12/693,345

(22) Filed: Jan. 25, 2010

(65) Prior Publication Data

US 2011/0182381 A1    Jul. 28, 2011

(51) Int. Cl.
*H04K 1/02* (2006.01)

(52) U.S. Cl. ........ 375/296; 375/295; 375/316; 370/315; 370/333

(58) Field of Classification Search ............ 375/296, 375/316; 370/315, 333
See application file for complete search history.

(56) References Cited

U.S. PATENT DOCUMENTS

| 2003/0023931 | A1 | 1/2003 | Hwang |
| 2007/0253496 | A1* | 11/2007 | Giannakis et al. ............ 375/260 |
| 2008/0012740 | A1* | 1/2008 | Li et al. ........................ 341/107 |
| 2009/0115649 | A1 | 5/2009 | Wu |
| 2009/0217139 | A1 | 8/2009 | Roh et al. |
| 2010/0157878 | A1* | 6/2010 | Zeitler et al. .................. 370/315 |

FOREIGN PATENT DOCUMENTS

| CN | 101227293 A | 7/2008 |
| WO | WO 2008/040259 A1 | 4/2008 |

OTHER PUBLICATIONS

Written Opinion of the International Searching Authority, PCT Application No. PCT/CN2011/070415, Applicant: Huawei Technologies Co., LTD., et al., Mailing date: Apr. 28, 2011, 14 pages.

* cited by examiner

*Primary Examiner* — Zewdu Kassa

(74) *Attorney, Agent, or Firm* — Slater & Matsil, L.L.P.

(57) ABSTRACT

A system and method for digital communications with unbalanced codebooks is provided. A transmitter includes a channel encoder that generates an output codeword from an information vector provided by an information input, and a modulator/transmitter circuit coupled to the channel encoder. The modulator/transmitter circuit prepares the output codeword for transmission over a physical channel. The channel encoder encodes the information vector into an intermediate codeword using a first code and shapes the intermediate codeword into the output codeword having a desired distribution.

22 Claims, 3 Drawing Sheets

SYSTEM AND METHOD FOR DIGITAL COMMUNICATIONS WITH UNBALANCED CODEBOOKS

TECHNICAL FIELD

The present invention relates generally to digital communications, and more particularly to a system and method for digital communications with unbalanced codebooks.

BACKGROUND

A binary sequence may have a prescribed fraction p of '1's. A special case occurs when p=0.5, wherein a codebook and its codewords are considered to be a balanced codebook with balanced codewords. Otherwise, the codebook and its codewords are considered to be an unbalanced codebook with unbalanced codewords.

Generally, in information theory, the channel capacity (i.e., the highest possible throughput that may be reliably communicated over a given channel) may be achieved only if a codebook used has an optimal input distribution. While the channel capacity concept has been known for 60 years, most of the codes that are used in digital communications systems are binary linear codes, which necessarily have Bernoulli (0.5) composition. That is, most of the codewords of binary linear codes have approximately half '1's and half '0's.

The use of binary linear codes limits the capacity-approaching possibility of channel codes to a small number of channel types, such as additive white Gaussian noise channels or binary symmetric channels. For channels with an optimal input composition other than Bernoulli (0.5), there may be very limited success in finding effective coding and decoding algorithms. Therefore, effective ways to generate error correction channel codes with good distance properties, i.e., good error correction capability given a prescribed composition, may extend performance success in channel coding theory to a wider range of channel types.

SUMMARY OF THE INVENTION

These and other problems are generally solved or circumvented, and technical advantages are generally achieved, by embodiments of a system and method for digital communications with unbalanced codebooks.

In accordance with an embodiment, a transmitter is provided. The transmitter includes a channel encoder and a modulator/transmitter circuit coupled to the channel encoder. The channel encoder generates an output codeword from an information vector provided by an information input, encodes the information vector into an intermediate codeword using a first code, and shapes the intermediate codeword into the output codeword, wherein the output codeword has a desired distribution. The modulator/transmitter circuit prepares the output codeword for transmission over a physical channel.

In accordance with another embodiment, a receiver is provided. The receiver includes a demodulator/receiver circuit coupled to a communications channel, and a channel decoder coupled to the demodulator/receiver circuit. The demodulator/transmitter circuit prepares a received signal provided by the communications channel for data processing, and the channel decoder generates an estimated information vector from the prepared received signal. The channel decoder includes an inverse shaping filter and a sub-decoder of a first code.

In accordance with another embodiment, a method for transmitting information is provided. The method includes receiving an information vector, encoding the information vector into an intermediate codeword using a first code, shaping the intermediate codeword into an output codeword having a desired distribution, and transmitting the output codeword.

An advantage of an embodiment is that codebooks and codewords with any desired composition p may be easily generated. The easy generation of codebooks and codewords allow for the finding of effective coding and decoding algorithms, channel codes with good error correction capability, and so forth, for a wider range of channel types.

A further advantage of an embodiment is that a linear code may be shaped into a codebook and codewords having a desired composition p instead of directly generating a codebook and codewords with the desired composition p. Linear codes are widely known, used, and understood in digital communications. Additionally, linear codes are easily generated, thereby simplifying the generation of the codebook and codewords with the desired composition p.

The foregoing has outlined rather broadly the features and technical advantages of the present invention in order that the detailed description of the embodiments that follow may be better understood. Additional features and advantages of the embodiments will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The embodiments will be described in a specific context, namely a digital communications system that operates with unbalanced codebooks and codewords. The invention may be applied to wireless or wireline, single-user or multi-user digital communications systems.

The effective design of codebooks and codewords with arbitrary compositions may be instrumental in multi-user communications channels. While multi-user information theory has made much progress, including results on the use of broadcasting channels, relay nodes, interference channels, secrecy codes, and so on, a relatively small number of the results have been implemented in practice. A critical issue is that the composition of a code used in the multi-user communications often depends on other messages. Therefore, there are significantly more requirements on the distribution of the codes and in more varieties. Modern coding theory, with a focus on designing balanced binary codes, may have become an obstacle in bringing multi-user information theory results to practice.

Figure 1:
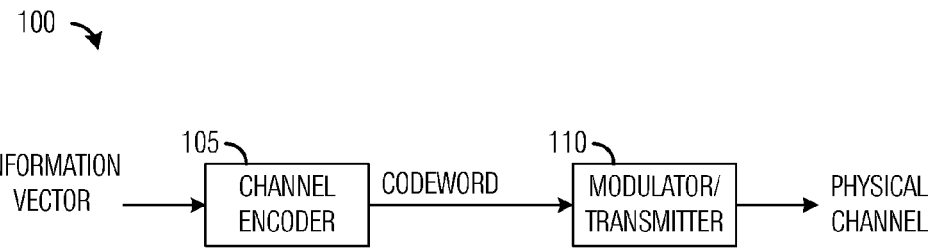
FIG. 1 is a diagram of a transmit portion of a communications device.

FIG. 1 illustrates a transmit portion of a communications device 100, wherein circuitry in a transmit chain are shown. Communications device 100 includes a channel encoder 105 that may be used to convert information to be transmitted (in the form of an information vector) into one or more codewords. Channel encoder 105 may select a codeword from a codebook to represent the information vector. The codeword and the codebook may have a Bernoulli (p) distribution where $p \ne 0.5$, i.e., the codebook and the codeword are not balanced. The codewords outputted by channel encoder 105 may then be provided to a modulator/transmitter 110. Modulator/transmitter 110 may be used to provide processing for the codewords in order to prepare the codewords for transmission. Modulator/transmitter 110 may perform processing such as modulating, interleaving, amplifying, filtering, digital to analog conversion, and so forth. Output from modulator/transmitter 110 may be injected onto a physical channel. The physical channel may be a wireless communications channel or a wireline physical channel.

Figure 2:
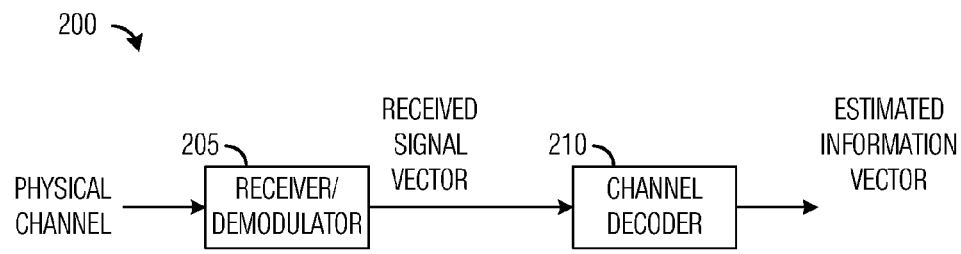
FIG. 2 is a diagram of a receive portion of a communications device.

FIG. 2 illustrates a receive portion of a communications device 200, wherein circuitry in a receive chain are highlighted. Communications device 200 includes a receiver/demodulator 205 that may be used to convert a signal received over a communications channel into a received signal vector, wherein the communications channel may be a wireless or wireline communications channel. Receiver/demodulator 205 may provide processing to the received signal, including demodulating, de-interleaving, amplifying, filtering, analog to digital conversion, and so forth. Output of receiver/demodulator 205 may be provided to a channel decoder 210 that may be used to convert the received signal vector into an estimated information vector, which may be a representation of an information vector transmitted to communications device 200 altered by the communications channel.

Channel decoder 210 may convert the received signal vector (comprised of received codewords) back to the estimated information vector using a codebook and codewords having a Bernoulli (p) distribution where $p \ne 0.5$. For example, channel decoder 210 may take the received signal vector as input and use a hard or soft decision decoding algorithm based on the codebook to determine the estimated information vector.

An operation that maps an input high dimensional binary sequence with a given length to an output binary sequence with a given new length and desired new composition may be considered to be a shaping filter. The output binary sequence may statistically have a prescribed fraction p of '1's. When applied to a codebook (typically a collection of long binary sequences) the shaping filter generates a new codebook with the same number of codewords having good distance from each other and a desired fraction of '1's. The operation of the shaping filter may therefore be viewed as shaping the composition of the codebook to an arbitrary Bernoulli (p) distribution. If $p \ne 0.5$, the codebook and its codewords are considered to be an unbalanced codebook with unbalanced codewords. As used herein, a codebook with a Bernoulli (p) distribution means that the fraction of '1's in most codewords is approximately p, while a few codewords may not have approximately fraction p of '1's (for example, an all zero codeword and an all-one codeword).

Figure 3:
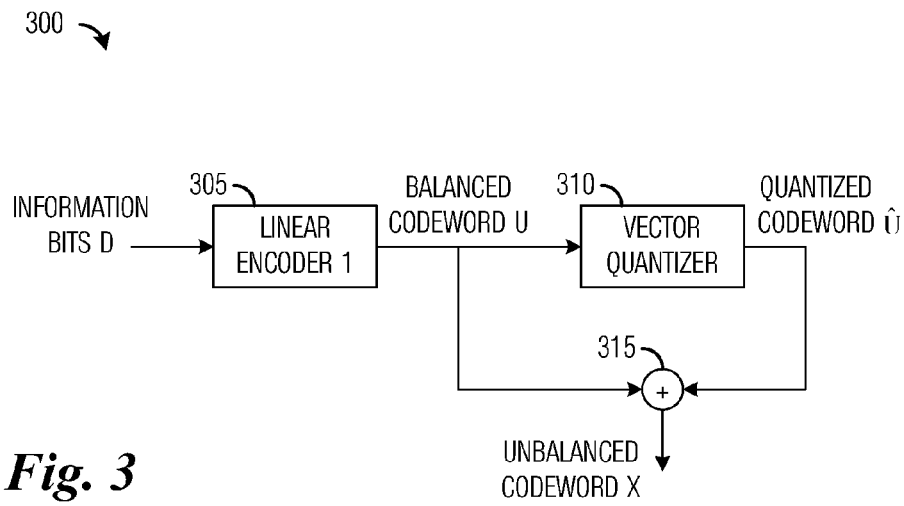
FIG. 3 is a diagram of a channel encoder that performs conversion of information bits into unbalanced codewords using a vector quantizer.

FIG. 3 illustrates a channel encoder 300 that performs conversion of information bits into unbalanced codewords using a vector quantizer to generate an unbalanced codebook. Channel encoder 300 may be an embodiment of channel encoder 105 shown in FIG. 1. Channel encoder 300 includes a linear encoder "LINEAR ENCODER 1" 305 (i.e., a sub-encoder) that may be used to generate codewords from the information bits. Linear encoder 305 preferably generates a good linear code that has codewords that are uniformly and sparsely distributed from a space of binary sequences. The linear code generated by linear encoder 305 may have a Bernoulli (0.5) distribution, i.e., the linear code is a balanced code. Output of linear encoder 305 may be a sequence of balanced codewords U. The balanced codewords U may be referred to as intermediate codewords.

The output of linear encoder 305 may be provided to a vector quantizer 310. Vector quantizer 310 may preferably be implemented as a decoder for a second linear code. The second linear code may have a lower rate than the code rate of the linear code 1 of linear encoder 305. Output of vector quantizer 310 may be a sequence of quantized codewords $\hat{U}$. A difference calculator 315 may compute a quantization error, i.e., a difference between U and $\hat{U}$. The quantization error produced by difference calculator 315 may be considered to be unbalanced codewords X having desired Bernoulli (p) distribution. After vector quantization, a quantization error will also be sparsely and uniformly distributed in a corresponding typical set, governed by its statistical distribution. Therefore, a carefully chosen vector quantizer and controlled distribution of the quantization error may allow the use of quantization error (output of difference calculator 315) as the unbalanced codewords X. Together vector quantizer 310 and difference calculator 315 can be considered a shaping filter, where the intermediate codeword U is shaped into the output codeword X having the desired Bernoulli (p) distribution.

Vector quantization with high dimensionality may have computationally efficient implementations. One approach is to consider that the decoder of a standard linear code as a vector quantizer for the space of binary sequences. Then, the input to vector quantizer 310, e.g., codewords produced by linear encoder 305, may be viewed as an output of a noisy channel and the decoding procedure simply has to find a nearest codeword of linear code 2 as quantized codewords $\hat{U}$. Since linear code 1 and linear code 2 has the same codeword length N, but code 1 has a higher code rate, the code space of code 2 is sparser than the code space of code 1, thus providing a quantization effect when mapping codewords of linear code 1 to codewords of linear code 2. An advantage of utilizing the decoding procedure is that coding theory provides efficient quantizers of essentially arbitrary code rate and length. A complexity of such quantizers is well controlled, even if the dimensionality of the vectors is high.

Figure 4A:
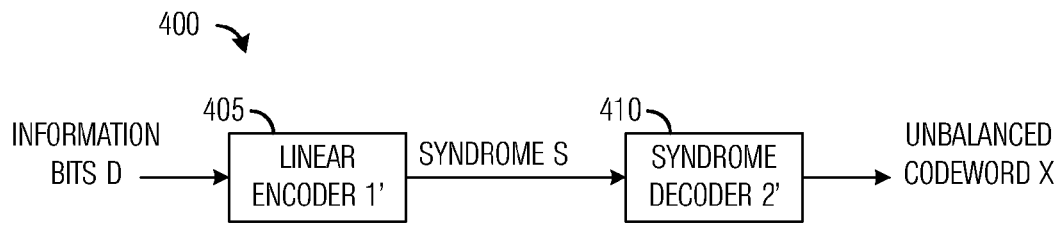
FIG. 4a is a diagram of a channel encoder that performs conversion of information bits into unbalanced codewords using a syndrome decoder.

FIG. 4a illustrates a channel encoder 400 that performs conversion of information bits into unbalanced codewords using a syndrome decoder. Channel encoder 400 may be another embodiment of channel encoder 105 shown in FIG. 1. Channel encoder 400 includes a linear encoder "LINEAR ENCODER 1'" 405 (i.e., a sub-encoder) that may be used to generate a syndrome S, and a syndrome decoder "SYNDROME DECODER 2'" 410 (i.e., a sub-decoder) that may be used to directly generate unbalanced codewords X from the syndrome S produced by linear encoder 405. Preferably, the first code used in the sub-encoder 405 is a linear code, and the second code used in the sub-decoder 410 is also a linear code. The sub-encoder 405 encodes the information vector into the intermediate codeword S using the first code, wherein S is also considered a syndrome of the second code. Syndrome decoder 410 may be used to find a syndrome leader and use the syndrome leader as the unbalanced codeword X, which may be sent over the physical channel. As shown in FIG. 4a, syndrome decoder 410 can be considered a shaping filter, where the intermediate codeword S is shaped into the output codeword X having the desired Bernoulli (p) distribution.

A connection between channel encoder 300 (FIG. 3) and channel encoder 400 may be understood as follows: The output of linear encoder 305 may be expressed as:

$U = G_1 \cdot D$, where $G_1$ is a generator matrix and vector D is the information bits. The balanced codewords U may be input of vector quantizer 310, which may produce as output quantized codewords Û. The output of difference calculator 315 may be unbalanced codewords X of the desired composition. To decode the balanced codewords U with the second linear code, it may be necessary to compute:

$S = H_2 \cdot U$ as the syndrome of the second linear code and then find a syndrome leader according to S.

It may be possible to merge the two steps of matrix multiplications (U and S above) into one to directly compute:

$S = (H_2 \cdot G_1) \cdot D$, which may be viewed as a single linear code, with generator matrix:

$G_1' = H_2 \cdot G_1$, where $G_1'$ is the generator matrix of the equivalent linear encoder "linear code 1'" 405, whose output is syndrome S.

Syndrome decoder 410 may be used to find a binary sequence X, which has a minimum number of 1's and satisfies:

$S = H_2' \cdot X$.

where $H_2'$ is the parity check matrix of the second code used in syndrome decoder 410. The operation of syndrome decoder 410 may generate an unbalanced codebook like the operation of vector quantizer 310 and difference calculator 315, where a regular decoder is used to decode for linear code $H_2'$, except that the decoded codeword Û is not explicitly computed. Instead the syndrome leader (a difference between U and Û) is directly computed, which is taken as the unbalanced codewords X.

An advantage of channel encoder 400 is that a requirement of multiplying two binary matrices is eliminated, i.e., it may be possible to design $G_1'$ instead of $H_2$ and $G_1$ separately. Another advantage of channel encoder 400 is that the finding of the syndrome leader is separated from the calculation of the syndrome. It may be easily verified that there is no longer a need to ensure that $H_2'$ is related to $G_1'$, where $H_2'$ is a parity check matrix of linear code 2' in FIG. 4a.

In order to optimize the performance of the resulting unbalanced code, it may be possible to separately design the linear code 1', whose generator matrix is $H_2 \cdot G_1$, to make sure that the resulting collection of syndromes is sparsely and uniformly distributed; and the procedure to find the syndrome leader, where the goal is to simplify the calculation. By controlling the rate of linear code 1', the syndrome leader of linear code 2' for only a subset of syndromes instead of all of the syndromes may need to be found. This may naturally eliminate the requirement that linear code 2', referred to as the shaping code, be a good channel code.

In the case that some syndrome leaders of linear code 2' have very low weights, corresponding to a poor minimum distance of the code, it may still be possible to avoid sampling on those syndromes by arranging the rate of linear code 1'. Therefore, virtually any linear code, no matter if it behaves well or poorly when used in a noise channel, may be a valid shaping code, yielding roughly the same performance.

Figure 4B:
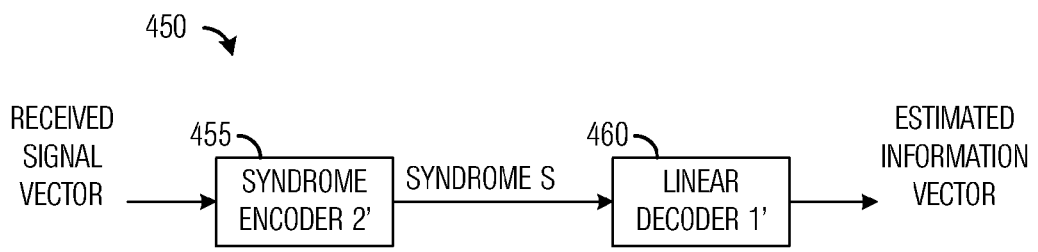
FIG. 4b is a diagram of a channel decoder that performs conversion of a received signal vector into estimated information vector using a syndrome encoder.

FIG. 4b illustrates a channel decoder 450 where the channel decoder is configured to generate an estimated information vector from the prepared received signal, wherein the channel decoder comprises an inverse shaping filter and a sub-decoder of a first code. The inverse shaping filter performs an inverse operation of a shaping filter in a transmitter, such as transmitter 400. In FIG. 4b, channel decoder 450 performs conversion of a received signal vector into estimated information vector using a syndrome encoder "SYNDROME ENCODER 2'" 455. Channel decoder 450 may be complementary to channel encoder 400. Channel decoder 450 may be an embodiment of channel decoder 210 shown in FIG. 2. Chanel decoder 450 includes a syndrome encoder "SYNDROME ENCODER 2'" 455 (i.e., a sub-encoder of the second code) that may be used to generate syndrome S of the second code from a received signal vector, and a linear decoder "LINEAR DECODER 1'" 460 (i.e., a sub-decoder of the first code) that may be used to generate an estimated information vector from the syndrome S (which may also be the intermediate codeword of the first code used in linear decoder 460) generated by syndrome encoder 455. In the receiver S may be represented by soft bits (i.e., S can take on any value) rather than hard bits (i.e., binary values only). Conceptually syndrome encoder 455 is the inverse shaping filter, which performs the inverse function of the shaping filter discussed previously.

Figure 5:
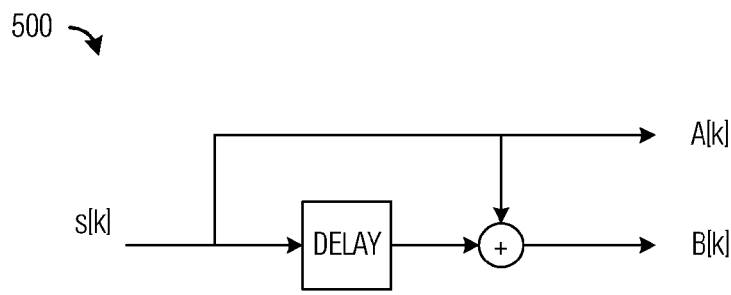
FIG. 5 is a block diagram of a rate 1/2 convolutional code.

FIG. 5 illustrates a block diagram 500 of a rate 1/2 convolutional code. A convolutional code is a type of linear code, on which syndrome decoder 410 and syndrome encoder 455 may be based. That is, FIG. 5 illustrates a second code used in the shaping filter and the inverse shaping filter. Block diagram 500 may be used to generate a rate 1/2 convolutional code and may be expressed as (1, 1+D), where D is a delay (shown in FIG. 5 as "DELAY"). Block diagram 500 may be used to implement a syndrome decoder, such as syndrome decoder 410 (FIG. 4a). As shown in FIG. 5, codeword X is composed of A[k] and B[k], and A[k]=S[k] and B[k]=S[k]+S[k−1], respectively.

Figure 6:
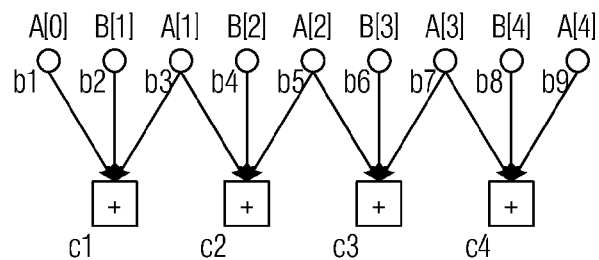
FIG. 6 is a bipartite graph of a rate 1/2 convolutional code shown in FIG. 5 with an input length of five.

FIG. 6 illustrates a bipartite graph 600 of the rate 1/2 convolutional code shown in FIG. 5 with an input length of five. While FIG. 6 shows only an example with codeword length 9, it is well understood that the convolutional code can be used to generate codeword of arbitrary length, and the corresponding convolutional decoder can decode received signal vector of arbitrary length. The syndrome decoder may be implemented based on bipartite graph 600. Bipartite graph 600 may be used to implement a syndrome decoder, such as syndrome decoder 410 (FIG. 4*a*). To facilitate the description of the decoding algorithm, the variable nodes of bipartite graph 600, shown as circles, may be labeled as b1, b2, . . . , b9. The variable nodes correspond to the codewords X with unbalanced composition. Also, check nodes of bipartite graph 600, shown as squares, may be labeled as c1, c2, c3, and c4. The check nodes correspond to the syndrome S.

Bipartite graph 600 means that several variable nodes add up to a corresponding check bit. For example, b1+b2+b3=c1, and b5+b6+b7=c3, and so forth. If codeword X is a valid codeword of the shaping code (which is the convolutional code of FIG. 5 in this case), all of the check bits should be zero. The check bits may be generated by linear code 1', meaning that the syndrome S (output of linear encoder 405 (FIG. 4*a*)) are placed on the check bits. The decoding process attempts to find a string with minimum weight that would satisfy all of the equations of the check bits. For example, if the check bits in bipartite graph 600 are "1011," then variable bits may be "0011001010," or "0100000100," and may other possibilities, with "01000000100" having lowest weight and thereby chosen as output codeword x.

The construction of the convolutional code may determine that if the syndrome bits are have Bernoulli (0.5) distribution, then the resulting codeword X has Bernoulli (p) distribution. For instance, the example shown in FIGS. 5 and 6 illustrate the direct generation of a Bernoulli (1/3) binary code from a Bernoulli (0.5) binary code using a (1, 1+D) convolutional code as the shaping code. Simulations show that this shaping code, when used with a good long linear code $G_1'$, has a good distance property, which is comparable to random Bernoulli (1/3) binary codes. In general, it may be possible to start from any convolutional code, and design the corresponding shaping code. A criterion in choosing the shaping code may be the shaping code's resulting distance property and its simplicity in implementation.

As shown above, finding the syndrome leader in the syndrome decoder 410 may be very simple if the convolutional code of 500 is used. First, pairs of consecutive bits may be tried in the check bits, with each of them marked by picking variable bits in between. For example, if both c2=c3=1, then b5=1 may satisfy both of them. The remaining single check bits are 1s, the corresponding degree 1 variable bits may be marked. For example, if c4=; 1, then b8 may be set to 1 without affecting any other equations. By inspection, the technique may be proven to give minimum weight codewords and yields good unbalanced codewords X, provided that the syndrome bits are generated from a good linear code, such as those generated by a good low-density parity-check (LDPC) code.

The convolutional code chosen for use as the shaping code may not be a good error correction code in and of itself. It has a poor minimum distance and the decoding is a very local operation: each non-zero parity check bit may be satisfied by flipping only a few (less than three) variable bits. However, the convolutional code is a good shaping code. Intuitively, a locality of a bipartite graph ensures that a small variation of the syndrome S leads to a small variation of the unbalanced codeword X. Similarly, strings with longer distances in S-space map onto strings with longer distances in X-space. Therefore, the mapping from syndrome S to unbalanced codeword X roughly preserves distances. Thus, when syndrome S is chosen with a good linear code with good distance property, the resulting unbalanced codeword X also have similar good distance properties.

Figures 7, 8:
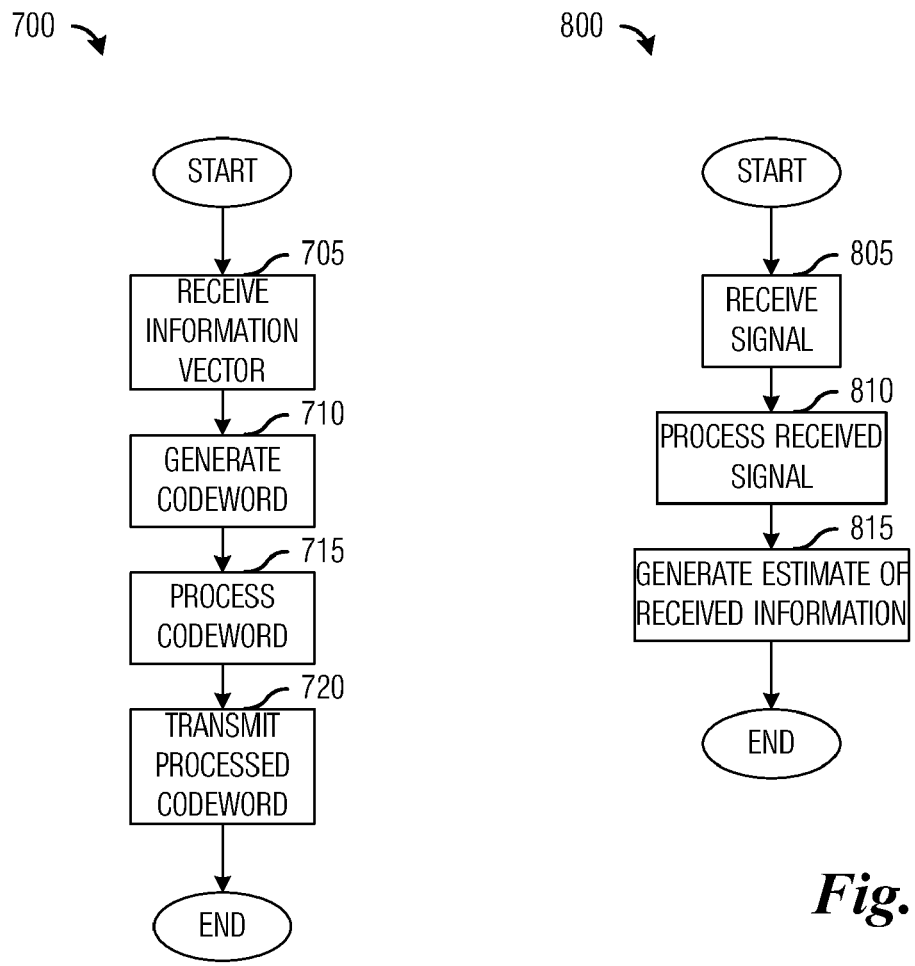
FIG. 7 is a flow diagram of transmitter operations in transmitting information.
FIG. 8 is a flow diagram of receiver operations in receiving information.

FIG. 7 illustrates a flow diagram of transmitter operations 700 in transmitting information. Transmitter operations 700 may be indicative of operations occurring in a transmitter, such as transmitter 100, as the transmitter transmits information to a receiver, wherein the transmitter makes use of codewords having a Bernoulli (p) distribution generated directly from a linear code with a Bernoulli (0.5) distribution. Transmitter operations 700 may occur while the transmitter is in a normal operating mode and has information to transmit to the receiver.

Transmitter operations 700 may begin with the transmitter receiving an information vector (block 705). The information vector may include the information to be transmitted to the receiver. The information vector may contain more information than a standard transmission unit, wherein a standard transmission unit may be a block of information that may be represented by a single codeword, and may need to be broken up into multiple standard transmission units.

The transmitter may then generate a codeword from a standard transmission unit's worth of information (block 710). According to an embodiment, the transmitter may make use of a binary code having a Bernoulli (p) distribution, wherein p specifies a percentage of 1's in the codeword statistically. For example, if p=0.5, then the binary code is a balanced code with approximately equal number of 1's to 0's in a codeword, while if p=0.4, then statistically speaking, the codeword of the codebook is expected to have approximately 40% 1's with the remaining 60% being 0's. The transmitter may generate the codeword by first generating a codeword using a first code having a Bernoulli (0.5) distribution and then using direct code generation with a second code with the same codeword length but a different code rate, generate a codeword having a Bernoulli (p) distribution. Preferably, the first code may be a linear code with desired error correction properties and minimum distance, while the second code may also be a linear code (for example, a convolutional code).

The codeword generated by the transmitter may then be processed for transmission (block 715). Processing for transmission may include modulating, interleaving, amplifying, filtering, digital to analog conversion, and so forth. The transmitter may then transmit the processed codeword (block 720). Transmitting the processed codeword may mean injecting the processed codeword onto a wireline communications channel or wirelessly transmitting the processed codeword with an antenna, a light/laser emitter, or so forth. Transmitter operations 700 may then terminate.

FIG. 8 illustrates a flow diagram of receiver operations 800 in receiving information. Receiver operations 800 may be indicative of operations occurring in a receiver, such as receiver 200, as the receiver receives information from a transmitter, wherein the transmitter makes use of codewords having a Bernoulli (p) distribution generated directly from a linear code with a Bernoulli (0.5) distribution. Receiver operations 800 may occur while the receiver is in a normal operating mode and has information being transmitted to the receiver.

Receiver operations 800 may begin with receiving a signal transmitted by the transmitter (block 805). The signal may correspond to the unbalanced codeword transmitted by the transmitter after it has been altered by a communications channel. The signal may be received over a wireline communications channel or a wireless communications channel. The receiver may then process the received signal (block 810). Processing performed by the receiver may include demodulating, deinterleaving, amplifying, filtering, analog-to-digital conversion, error correction, and so forth.

The receiver may then generate an estimate of the received information (block 815). The processing performed by the receiver generates a received signal vector that comprises estimates of codewords transmitted by the transmitter. The receiver may then use a channel decoder to decode the estimates of the codewords. The channel decoder may make use of codewords having a Bernoulli (p) distribution, wherein the codewords are directly generated from a code having a Bernoulli (0.5) distribution. The estimate of the received information may be used by other components of the receiver or electronic devices attached to the receiver. Receiver operations 800 may then terminate.

Although the embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A transmitter comprising:
    a channel encoder configured to generate an output codeword from an information vector provided by an information input, wherein generating the output codeword comprises encoding the information vector into an intermediate codeword using a first code, and shaping the intermediate codeword into the output codeword using a second code, and wherein the output codeword has a desired distribution, wherein the channel encoder comprises:
        a sub-encoder coupled to the information input, the sub-encoder configured to encode the information vector into the intermediate codeword using the first code; and
        a shaping filter coupled to the sub-encoder, the shaping filter configured to shape the intermediate codeword using the second code; and
    a modulator/transmitter circuit coupled to the channel encoder, the modulator/transmitter circuit configured to prepare the output codeword for transmission over a physical channel.

2. The transmitter of claim 1, wherein the output codeword has the desired distribution of Bernoulli (p), where p is a percentage of 1's in the output codeword, and wherein $p \neq 0.5$.

3. The transmitter of claim 1, wherein the sub-encoder comprises a linear encoder.

4. The transmitter of claim 3, wherein the linear encoder is configured to generate a syndrome of the second code from the information vector using the first code.

5. The transmitter of claim 1, wherein the shaping filter comprises a sub-decoder of the second code.

6. The transmitter of claim 5, wherein the second code is a linear code.

7. The transmitter of claim 6, wherein the sub-decoder comprises a syndrome decoder, the syndrome decoder configured to generate a syndrome leader.

8. The transmitter of claim 7, wherein the sub-decoder is configured to find a binary sequence X that has a minimum number of 1's and satisfies expression:

$$S = H_2 \cdot X,$$

where $H_2$ is a parity check matrix of the second code.

9. The transmitter of claim 6, wherein the second code is a convolutional code.

10. The transmitter of claim 5, wherein the first code has a higher code rate than the second code.

11. The transmitter of claim 1, wherein the shaping filter comprises:
    a vector quantizer coupled to the sub-encoder, the vector quantizer configured to quantize the intermediate codeword generated by the sub-encoder; and
    a difference calculator coupled to the sub-encoder and the vector quantizer, the difference calculator configured to generate the output codeword from the intermediate codeword and the quantized intermediate codeword.

12. The transmitter of claim 11, wherein the first code is a linear code.

13. The transmitter of claim 11, wherein the vector quantizer comprises a linear decoder.

14. A receiver comprising:
    a demodulator/receiver circuit coupled to a communications channel, the demodulator/receiver circuit configured to prepare a received signal provided by the communications channel for data processing; and
    a channel decoder coupled to the demodulator/receiver circuit, the channel decoder configured to generate an estimated information vector from the prepared received signal, wherein the channel decoder comprises an inverse shaping filter comprising a sub-encoder of a second code and configured to generate a syndrome of the second code from the prepared received signal, and a sub-decoder configured to generate the estimated information vector from the syndrome of the second code using a first code, wherein the sub-decoder comprises a decoder coupled to the inverse shaping filter, the decoder configured to generate the estimated information vector from an output of the inverse shaping filter.

15. The receiver of claim 14, wherein the first code is a linear code.

16. The receiver of claim 15, wherein the decoder is a linear decoder.

17. The receiver of claim 14, wherein the second code is a linear code.

18. The receiver of claim 17, wherein the sub-encoder comprises a syndrome encoder coupled to the demodulator/receiver circuit, the syndrome encoder configured to generate the syndrome of the second code from the prepared received signal.

19. A method for transmitting information, the method comprising:
    receiving an information vector from an information input;
    encoding, by a sub-encoder, the information vector into an intermediate codeword using a first code;
    shaping, by a shaping filter, the intermediate codeword into an output codeword using a second code, the output codeword having a desired distribution; and transmitting the output codeword over a physical channel;
wherein encoding the information vector comprises generating a syndrome of the second code from the information vector.

20. The method of claim 19, wherein the first code is a linear code.

21. The method of claim 19, wherein shaping the encoded information vector comprises generating a syndrome leader from the syndrome, wherein the syndrome leader is related to the second code.

22. The method of claim 21, wherein generating a syndrome leader comprises finding a binary sequence X that has a minimum number of 1's and satisfies expression:

$$S = H_2 \cdot X,$$

where $H_2$ is a parity check matrix of the second code.

* * * * *